United States Patent
Chen et al.

(10) Patent No.: US 11,880,252 B2
(45) Date of Patent: Jan. 23, 2024

(54) AUTOMATED POWER NOISE SUSCEPTIBILITY TEST SYSTEM FOR STORAGE DEVICE

(71) Applicant: SK hynix Inc., Gyeonggi-do (KR)

(72) Inventors: Xiaofang Chen, Milpitas, CA (US); Wenwei Wang, San Jose, CA (US); Dean Hogle, San Jose, CA (US)

(73) Assignee: SK hynix Inc., Gyeonggi-do (KR)

(*) Notice: Subject to any disclaimer, the term of this patent is extended or adjusted under 35 U.S.C. 154(b) by 466 days.

(21) Appl. No.: 17/307,157

(22) Filed: May 4, 2021

(65) Prior Publication Data
US 2022/0357781 A1    Nov. 10, 2022

(51) Int. Cl.
| | |
|---|---|
| *G06F 1/26* | (2006.01) |
| *H03F 3/45* | (2006.01) |
| *G05F 1/46* | (2006.01) |
| *H03K 5/1252* | (2006.01) |
| *G06F 13/16* | (2006.01) |
| *G06F 13/42* | (2006.01) |

(52) U.S. Cl.
CPC ............ *G06F 1/266* (2013.01); *G05F 1/46* (2013.01); *G06F 13/1668* (2013.01); *G06F 13/4282* (2013.01); *H03F 3/45475* (2013.01); *H03K 5/1252* (2013.01); *G06F 2213/0026* (2013.01)

(58) Field of Classification Search
CPC ..... G11C 29/021; G11C 29/025; G11C 29/04; G11C 2029/0407; G01R 29/0871; G01R 29/26; G01R 31/3183; G06F 1/266; G06F 13/1668; G06F 13/4282; G05F 1/46; H03F 3/45475; H03F 2203/45528; H03K 5/1252
See application file for complete search history.

(56) References Cited

U.S. PATENT DOCUMENTS

| | | | |
|---|---|---|---|
| 5,287,398 A * | 2/1994 | Briault | H04M 11/04 379/102.01 |
| 7,135,895 B2 | 11/2006 | Komura | |
| 9,581,645 B2 | 2/2017 | Sontakke et al. | |
| 2006/0171182 A1* | 8/2006 | Siri | H02M 3/33592 363/131 |
| 2013/0176401 A1* | 7/2013 | Monari | H04N 23/00 348/157 |

* cited by examiner

*Primary Examiner* — Giovanni Astacio-Oquendo
*Assistant Examiner* — Zannatul Ferdous
(74) *Attorney, Agent, or Firm* — IP & T GROUP LLP (57) ABSTRACT

Automated power noise susceptibility test systems are provided for one or more storage devices. A system includes a host; storage devices; and multiple noise injection modules. Each noise injection module includes: a first relay to a third relay, which are coupled to a first path or a second path. The first path includes: an operational amplifier for generating a high noise function; a first variable regulator for generating a first or second regulated power supply voltage; and a capacitor injection circuit for generating low noise function and a first power noise. The second path includes: a second variable regulator for generating a third or fourth regulated power supply voltage and a power amplifier injection circuit for generating a second power noise. The third relay selectively provides the storage device the first power noise or the second power noise.

20 Claims, 7 Drawing Sheets

AUTOMATED POWER NOISE SUSCEPTIBILITY TEST SYSTEM FOR STORAGE DEVICE

BACKGROUND

1. Field

Embodiments of the present disclosure relate to a scheme for a power noise susceptibility test of a storage device.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

A power noise susceptibility test or a power noise injection test has been used to screen storage devices such as hard disk drives (HDDs) and solid state drives (SSDs) for years. In this context, embodiments of the present invention arise.

SUMMARY

Aspects of the present invention include systems for an automated power noise susceptibility test of one or more storage devices.

In one aspect of the present invention, a system includes a host including a power supply configured to provide a power supply voltage; a plurality of storage devices coupled to the host through multiple peripheral component interconnect express (PCIe) links; and multiple noise injection modules for testing power noise susceptibility of the plurality of storage devices. Each noise injection module includes: a first relay configured to receive the power supply voltage and output the power supply voltage to a first path or a second path in response to a frequency selection signal; a second relay configured to receive a noise function and output the noise function to the first path or the second path in response to the frequency selection signal; and a third relay coupled to the first path or the second path in response to the frequency selection signal and the storage device. The first path includes: an operational amplifier configured to receive the noise function and generate a high noise function in response to the power supply voltage; a first variable regulator configured to receive and regulate the power supply voltage to generate a first or second regulated power supply voltage in response to a voltage selection signal; and a capacitor injection circuit configured to receive the first or second regulated power supply voltage, the noise function and the high noise function and generate a low noise function and a first power noise corresponding to the sum of the first or second regulated power supply voltage and the high noise function. The second path includes: a second variable regulator configured to receive and regulate the power supply voltage to generate a third or fourth regulated power supply voltage in response to the voltage selection signal; and a power amplifier injection circuit configured to receive the third or fourth regulated power supply voltage and the low noise function and generate a second power noise corresponding to the sum of the third or fourth regulated power supply voltage and the low noise function. The third relay selectively receives the first power noise and the second power noise in response to the frequency selection signal and provides the storage device with the selectively received power noise.

In another aspect of the present invention, a system for testing power noise susceptibility of a storage device includes: a first relay configured to receive a power supply voltage and output the power supply voltage to a first path or a second path in response to a frequency selection signal; a second relay configured to receive a noise function and output the noise function to the first path in response to the frequency selection signal; and a third relay coupled to the first path or the second path in response to the frequency selection signal and the storage device. The first path includes: an operational amplifier configured to receive the noise function and generate a high noise function in response to the power supply voltage; and a capacitor injection circuit configured to receive the power supply voltage, the noise function and the high noise function and generate a low noise function and a first power noise corresponding to the sum of the power supply voltage and the high noise function. The second path includes: a regulator configured to receive the power supply voltage and regulate the power supply voltage to generate a regulated power supply voltage; and a power amplifier injection circuit configured to receive the regulated power supply voltage and the low noise function and generate a second power noise corresponding to the sum of the power supply voltage and the low noise function. The third relay selectively receives the first power noise and the second power noise in response to the frequency selection signal and provides the storage device with the selectively received power noise.

In still another aspect of the present invention, a system for testing power noise susceptibility of a storage device includes: a first relay configured to receive a power supply voltage and output the power supply voltage to a first path or a second path in response to a frequency selection signal; a second relay configured to receive a noise function and output the noise function to the first path or the second path in response to the frequency selection signal; and a third relay coupled to the first path or the second path in response to the frequency selection signal and the storage device. The first path includes: a first regulator configured to receive the power supply voltage and regulate the power supply voltage to generate a first regulated power supply voltage; an operational amplifier configured to receive the noise function and generate a high noise function in response to the first regulated power supply voltage; and a capacitor injection circuit configured to receive the power supply voltage, the noise function and the high noise function and generate a low noise function and a first power noise corresponding to the sum of the power supply voltage and the high noise function. The second path includes: a second regulator configured to receive the power supply voltage and regulate the power supply voltage to generate a second regulated power supply voltage; and a power amplifier injection circuit configured to receive the second regulated power supply voltage and the low noise function and generate a second power noise corresponding to the sum of the power supply voltage and the low noise function. The third relay selectively receives the first power noise and the second power noise in response to the frequency selection signal and provides the storage device with the selectively received power noise.

Additional aspects of the present invention will become apparent from the following description.

DETAILED DESCRIPTION

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The present invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the present invention may take, may be referred to as techniques. In general, the order of the steps of disclosed processes may be altered within the scope of the present invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the present invention is provided below along with accompanying figures that illustrate aspects of the present invention. The present invention is described in connection with such embodiments, but the present invention is not limited to any embodiment. The scope of the present invention is limited only by the claims. The present invention encompasses numerous alternatives, modifications and equivalents within the scope of the claims. Numerous specific details are set forth in the following description in order to provide a thorough understanding of the present invention. These details are provided for the purpose of example; the present invention may be practiced according to the claims without some or all of these specific details. For clarity, technical material that is known in technical fields related to the present invention has not been described in detail so that the present invention is not unnecessarily obscured.

A power noise susceptibility test or a power noise injection test has been used to screen storage devices such as hard disk drives is (HDDs) and solid state drives (SSDs) for years. For this test, sine or square wave noise with certain amplitude and frequency is injected into a power supply rail of a storage device. Further, it checks whether the storage device can work normally without errors, failures, or performance drops. These tests ensure the quality and reliability of the storage device when the tests are used in different computer or server platforms having a wide range of power supply quality and integrity.

Figure 1:
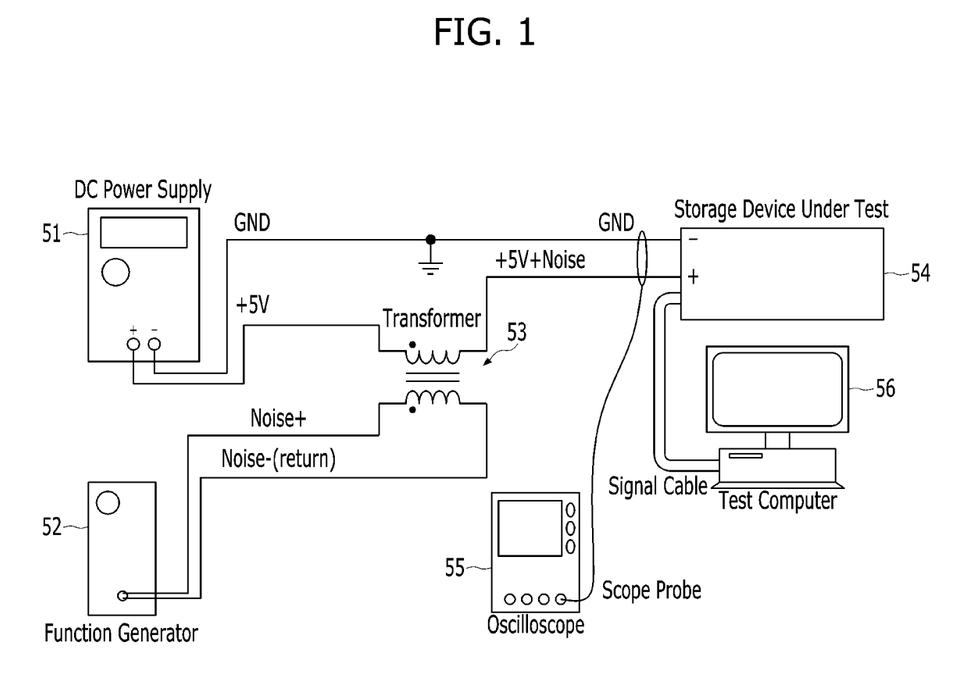
FIGS. 1 to 3 are diagrams illustrating examples of a power noise susceptibility test system for a storage device.
Figure 2:
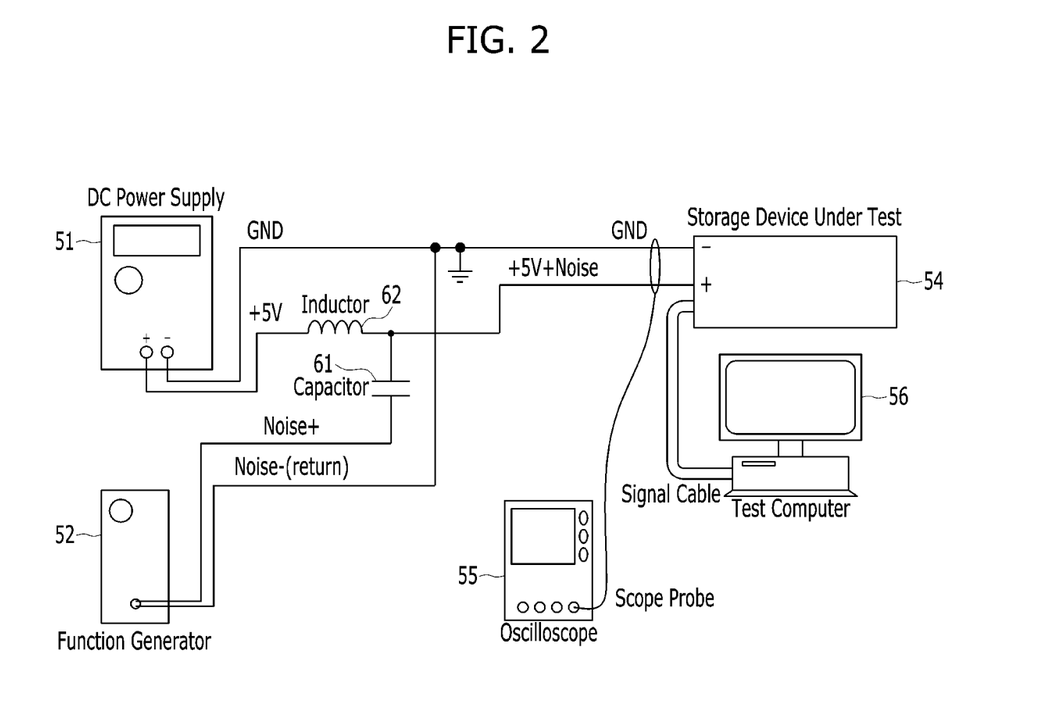
Figure 3:
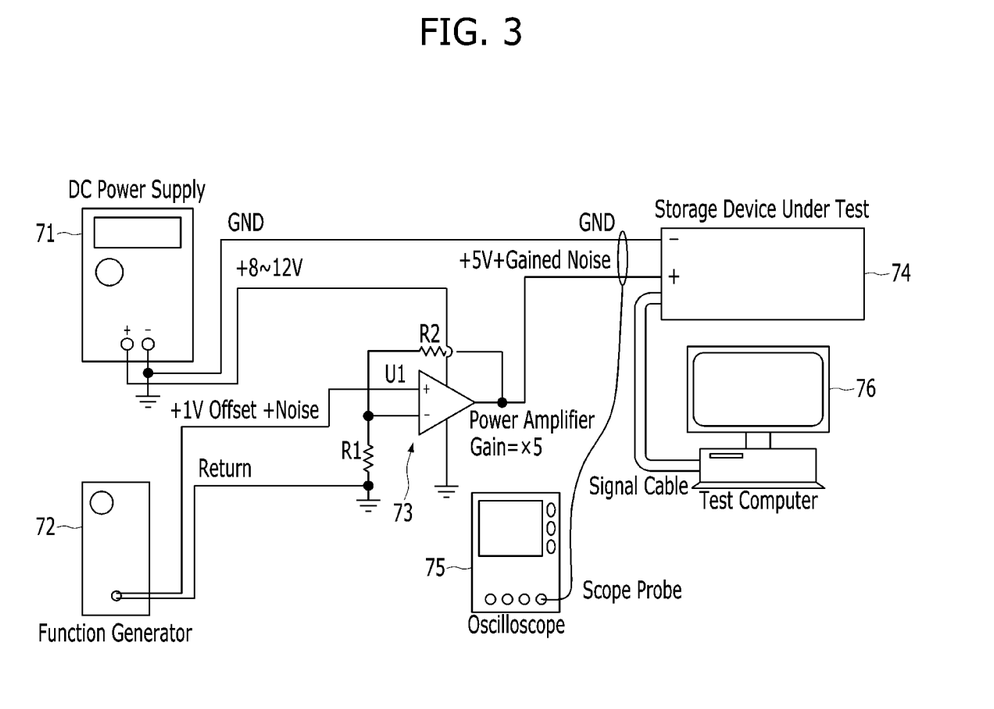

Examples of a power noise susceptibility test system for a storage device are illustrated in FIGS. 1 to 3.

As shown in FIGS. 1 to 3, the power noise susceptibility test system may include a power supply 51 or 71, a function generator 52 or 72, a storage device under test (hereinafter referred to as the storage device) 54 or 74, an oscilloscope 55 or 75, and a test computer 56 or 76. Further, the power noise susceptibility test system may include a power noise injection component. The power noise injection component may be implemented using various methods.

In an implementation of FIG. 1, the power noise injection component may be implemented with a transformer induction component 53. In an implementation of FIG. 2, the power noise injection component may be implemented with a capacitor injection component 61 and 62. In an implementation of FIG. 3, the power noise injection component may be implemented with a power amplifier direct injection component 73. These implementations are described in U.S. patent application Ser. No. 16/834,464, entitled "NOISE INJECTION FOR POWER NOISE SUSCEPTIBILITY TEST FOR MEMORY SYSTEMS" which is incorporated by reference herein in its entirety.

The power supply 51 or 71 may generate a power supply voltage (e.g., +5V or +8~12V). The function generator 52 or 72 may generate noise or noise function (e.g., Noise+ or {+1V Offset+Noise}). The oscilloscope 55 or 75 may measure the changing voltage (combined positive power supply and power noise) over time. The test computer 56 or 76 may be coupled to the storage device 54 or 74.

As noted above, FIGS. 1 to 3 show three different power noise injection methods used in power noise susceptibility test for a storage device (e.g., a solid state drive (SSD)). Since the methods have different bandwidth limits, none of the methods could fully cover bandwidths required by many SSD users (e.g., test bandwidth from DC to 30 MHz).

The methods of FIGS. 1 and 3 work at a lower frequency band. The method of FIG. 1 typically works at frequencies less than 100 kHz. The method of FIG. 3 works best at frequencies less than 500 kHz, but with much better performance and more linear response than the transformer induction method of FIG. 1, In contrast, the method of FIG. 2 works at a higher frequency band (e.g., greater than or equal to 100 kHz and up to around 50 MHz). At lower frequencies less than 100 kHz, little noise could be coupled to the power source the power supply 51) due to the low frequency blocking nature of the capacitor 61.

In the implementations above which have been proposed, the power noise susceptibility test for storage devices has to be separately performed at different test stands to cover the noise frequency from low (DC to 100 kHz) to high (100 kHz to 20~30 MHz, in some case up to 50 MHz) as required.

To cover the full frequency band, the operator simply uses connection settings in FIG. 1 or FIG. 2 to test noise susceptibility at less than 100 kHz. Testing noise susceptibility from 100 kHz to 50 Mhz requires changes to the connection settings of FIG. 3 manually. The sweeping of noise frequency and amplitude can be manual or remotely controlled by test scripts. The results monitoring and recording can also be either manually done or automated.

These implementations above are easy to construct and use. However, there are several drawbacks: 1) manual operation means slower test speed, and higher risk of human errors; 2) need to change the test circuit setup during tests, and it's subject to longer setup time, as well as risk of human errors; 3) can test only one SSD at a time, difficult to use for large scale SSD tests; 4) there will be many circuit boards to cover different SSD form factors: 12V for U.2 SSDs and 3.3V for M.2 SSDs; and 5) needs an external power supply and needs to be adjusted manually. Accordingly, it is desirable to provide automated power noise susceptibility test platforms (or systems) supporting full frequency bandwidth.

Figure 4:
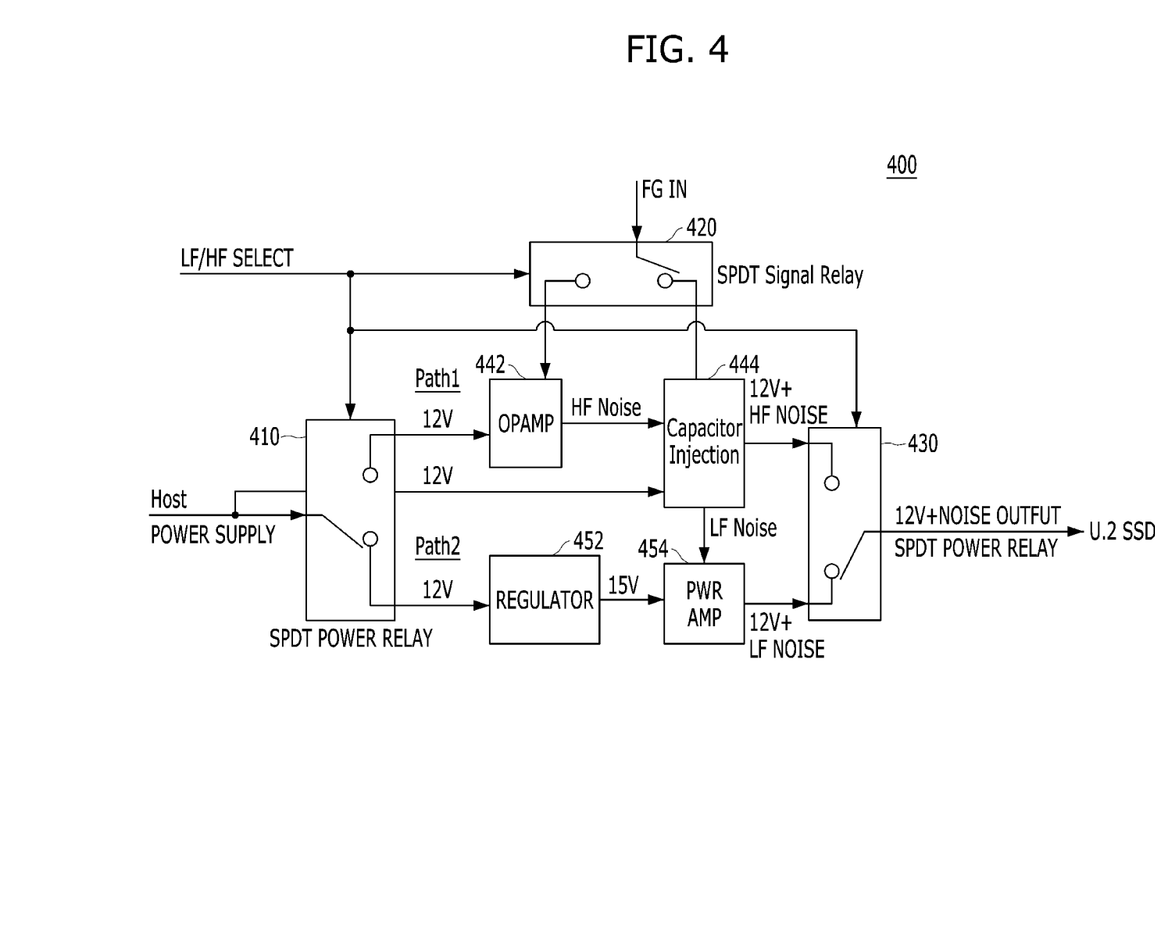
FIG. 4 is a diagram illustrating a power noise susceptibility test system in accordance with an embodiment of the present invention.
Figure 5:
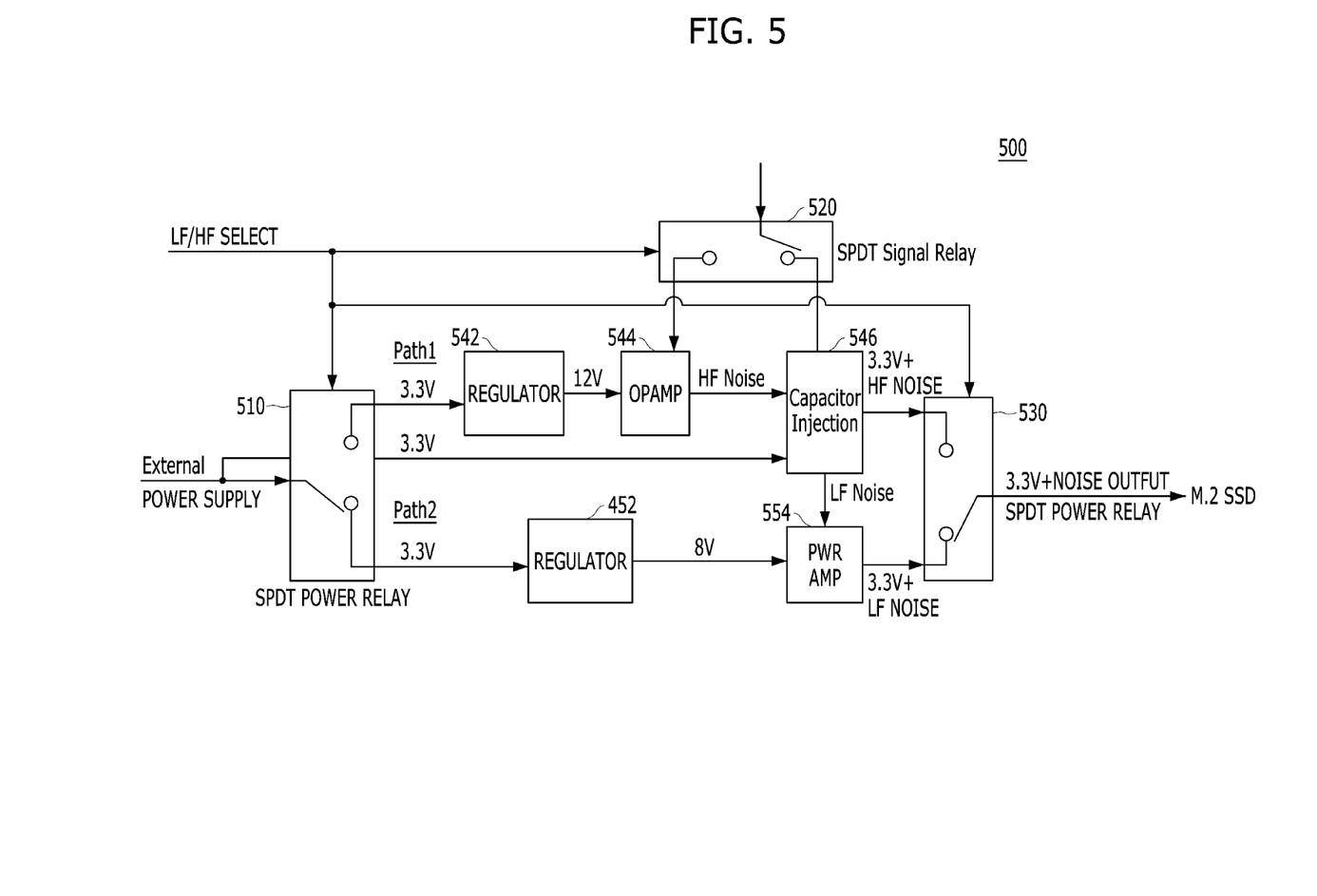
FIG. 5 is a diagram illustrating a power noise susceptibility test system in accordance with an embodiment of the present invention.

Embodiments may provide two automated full bandwidth power noise susceptibility test systems. These embodiments are described in FIGS. 4 and 5. By way of example and without any limitation, the embodiment of FIG. 4 is used for SSD form factors such as U.2, U.3 or enterprise and data center SSD form factor (EDSFF), whereas the embodiment of FIG. 5 is used for SSD form factors such as M.2. Also, embodiments may provide a modular automatic full bandwidth power noise susceptibility test system. This embodiment is described with FIGS. 6 and 7. Some acronyms and abbreviations are used in order to describe the test systems of FIGS. 4 to 7 as shown in List1:

| List1: |
|---|
| SSD: Solid State Drive |
| SPDT: Single-Pole Double-Throw |
| FG: Function Generator |
| LF: Low Frequency |
| HF: High Frequency |
| OPAMP: Operational Amplifier |
| PWR AMP: Power Amplifier |
| PCIE: Peripheral Component Interconnect Express |
| USB: Universal Serial Bus |
| GPIB: General Purpose Interface Bus |
| I/O: Input/Output |

Figure 6:
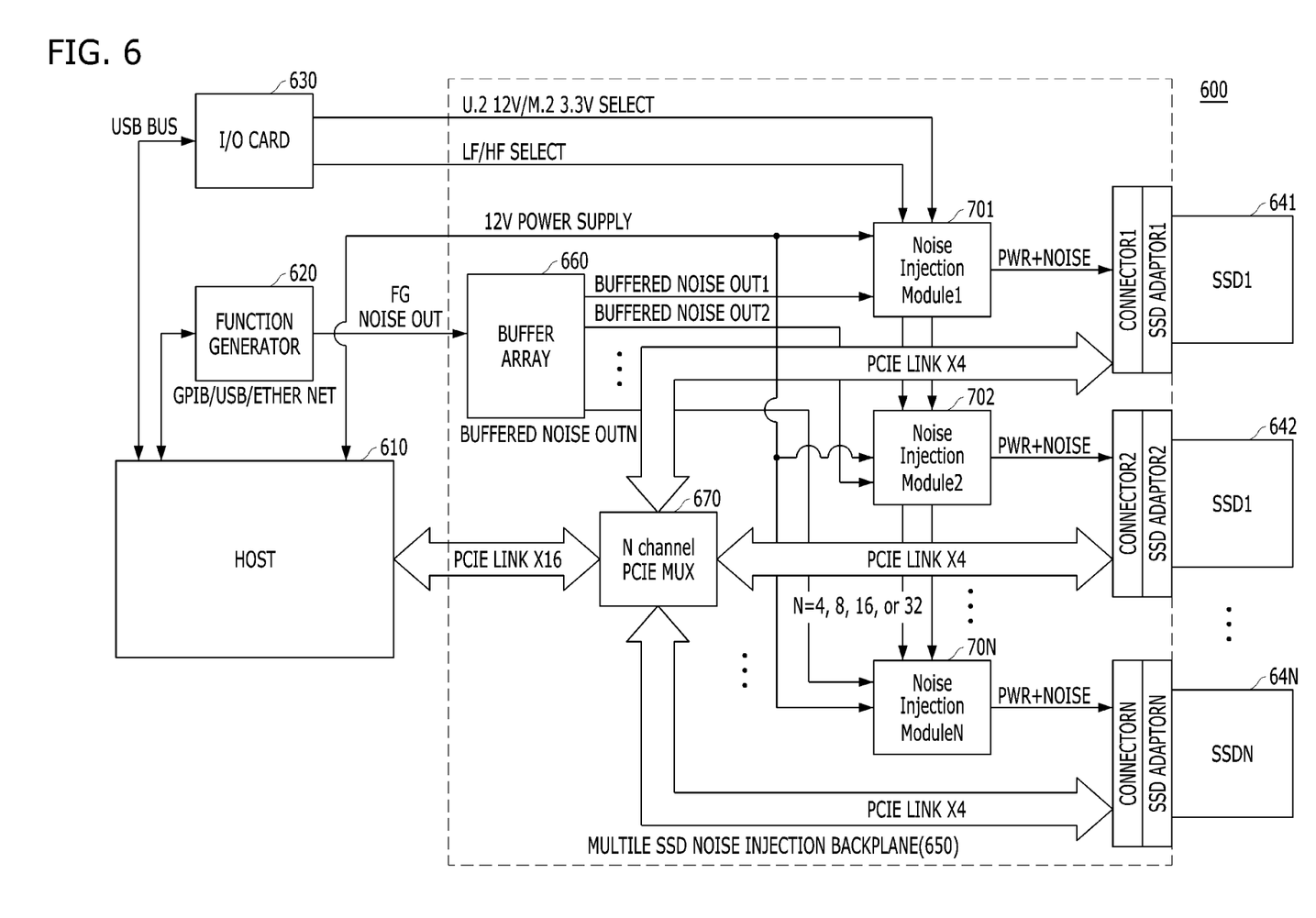
FIG. 6 is a diagram illustrating a multiple power noise susceptibility test system in accordance with an embodiment of the present invention.

FIG. 4 is a diagram illustrating a power noise susceptibility test system 400 in accordance with an embodiment of the present invention. Although not shown in FIG. 4, the power noise susceptibility test system 400 may include the function generator, the storage device under test, the oscilloscope and the test computer, as shown in FIGS. 1 to 3. However, no external power supply is required as this test platform uses a power supply voltage 12V directly received from PCIe based host or server as shown in FIG. 6.

Referring to FIG. 4, the power noise susceptibility test system 400 may include a first relay 410, a second relay 420 and a third relay 430. The first relay 410 and the third relay 430 may be coupled through a first path Path1 or a second path Path2.

The first relay 410 may receive a power supply voltage (e.g., 12V) and output the power supply voltage (12V) to the first path Path1 or the second path Path2 in response to a frequency selection signal LF/HF SELECT. In some embodiments, the power supply voltage may be received from a power supply of a host as shown in FIG. 6.

The second relay 420 may receive a noise function FG IN and output the noise function FG IN to the first path Path1 in response to the frequency selection signal LF/HF SELECT.

The third relay 430 may be coupled to the first path Path1 or the second path Path2 in response to the frequency selection signal LF/HF SELECT and the storage device (e.g., U.2 SSD).

The first path Path1 may include an operational amplifier OPAMP 442 and a capacitor injection circuit 444. The operational amplifier OPAMP 442 may receive the noise function FG IN and generate a high noise function HF NOISE in response to the power supply voltage (12V). The capacitor injection circuit 444 may receive the power supply voltage (12V), the noise function FG IN and the high noise function HF NOISE and generate a low noise function LF NOISE and a first power noise corresponding to the sum of the power supply voltage and the high noise function (12V+HF NOISE).

In some embodiments, the capacitor injection circuit 444 may be implemented with the capacitor 61 and the inductor 62 as shown in FIG. 2. In this implementation, the inductor 62 may receive the power supply voltage (12V) instead of the voltage (5V) in FIG. 2 and the capacitor 61 may receive the noise function FG IN from the second relay 420 or the high noise function (HF NOISE) from the operational amplifier 442. For example, the noise function FG IN is received from the second relay 420 in response to the frequency selection signal LF/HF SELECT corresponding to the low frequency band (e.g., logic "0"). For another example, the high noise function (HF NOISE) is received from the operational amplifier 442 in response to the frequency selection signal LF/HF SELECT corresponding to the high frequency band (e.g., logic "1").

The second path Path2 may include a regulator 452 and a power amplifier injection circuit 454. The regulator 452 may receive the power supply voltage (12V) and regulate the power supply voltage to generate a regulated power supply voltage (15V) greater than the power supply voltage (12V). The power amplifier injection circuit PWR AMP 454 may receive the regulated power supply voltage (15V) and the low noise function LF NOISE and generate a second power noise corresponding to the sum of the power supply voltage and the low noise function (12V+LF NOISE).

In some embodiments, the power amplifier injection circuit PWR AMP 454 may be implemented with the power amplifier, the resistor R1 and the resistor R2, as shown in FIG. 3. As illustrated in FIG. 3, the resistor R1 is coupled between an inversion terminal of the power amplifier and a ground terminal, and the resistor R2 is coupled between the inversion terminal and an output terminal of the power amplifier. In this implementation, the power amplifier may receive the regulated power supply voltage (15V) from the regulator 452 instead of the voltage (8~12V) in FIG. 3. Further, the power amplifier may receive the low noise function LF NOISE from the capacitor injection circuit 444 through a non-inversion terminal.

The third relay 430 may selectively receive the first power noise (12V+HF NOISE) and the second power noise (12V+LF NOISE) in response to the frequency selection signal LF/HF SELECT and provide the storage device (U.2 SSD) with the selectively received power noise.

In some embodiments, the first relay 410 may include a single pole double throw (SPDT) power relay having a single pole configured to receive the power supply voltage (12V), a first throw coupled to the first path Path1 and a second throw coupled to the second path Path2. The SPDT power relay may provide the first path Path1 or the second path Path2 with the power supply voltage (12V) in response to the frequency selection signal LF/HF SELECT.

In some embodiments, the second relay 420 may include a single pole double throw (SPDT) signal relay having a single pole configured to receive the noise function FG IN, a first throw coupled to the operational amplifier 442 and a second throw coupled to the capacitor injection circuit 444. The SPDT signal relay may provide the operational amplifier 442 or the capacitor injection circuit 444 with the noise function FG IN in response to the frequency selection signal LF/HF SELECT.

In some embodiments, the third relay 430 may include a single pole double throw (SPDT) power relay having a first throw coupled to the capacitor injection circuit 444, a second throw coupled to the power amplifier injection circuit 454 and a single pole configured to the storage device (U.2 SSD). The SPDT power relay may selectively provide the storage device with the first power noise (12V+HF NOISE) and the second power noise (12V+LF NOISE) in response to the frequency selection signal LF/HF SELECT.

In some embodiments, detailed selections and designs of the relays 410-430, the operational amplifier 442, the regulator 452, the power amplifier injection circuit 454 may vary according to test platform specifications. In an implementation, heat sinks may be used for the power amplifier injection circuit 454.

In some embodiments, the function generator and the host in FIG. 6 may be used for the power noise susceptibility test system 400. The remote control of the function generator in FIGS. 2 and 3 may be either GPIB, USB, or Ethernet as shown in FIG. 6, using a set software (e.g., Labview software) or customized scripts. The host may run customized I/O test scripts, FIO, or IOmeter with logging functions.

In some embodiments, the signal LF/HF SELECT may be received from extended USB I/O card (e.g., GPIO card) of the host as shown in FIG. 6.

When the signal LF/HF SELECT equals to a logic level "0", it drives three SPDT relays 410, 420 and 430 to normally close (NC) positions, the noise FG IN is provided to the power amplifier injection circuit 454, and the power supply voltage (12V) is provided to the power amplifier injection circuit 454. Thus, the power amplifier injection circuit 454 for a low frequency test is enabled as shown in FIG. 3 and the output of the power amplifier injection circuit 454 is provided to the storage device through the SPDT relay 430.

When the signal LF/HF SELECT" equals to a logic level "1", it drives the three SPDT relays 410, 420 and 430 to normally open (NO) positions, the noise FG IN is provided to the operational amplifier 442, the power supply voltage (12V) is provided to the operational amplifier 442 and the capacitor injection circuit 444. Thus, the capacitor injection circuit 444 for a high frequency test is enabled as shown in FIG. 2 and the output of the capacitor injection circuit 444 is provided to the storage device through the SPDT relay 430.

As noted above, the power noise susceptibility test system 400 utilizes 3 remote controlled SPDT relays to automatically switch between low and high test frequencies. The test platform may eliminate the risky manual operations and reduce the total test time significantly. This test platform may be cost effective for small scale tests using workstations or low end servers.

FIG. 5 is a diagram illustrating a power noise susceptibility test system 500 in accordance with an embodiment of the present invention.

Referring FIG. 5, the power noise susceptibility test system 500 may have the structure and operation, which are similar to those of the power noise susceptibility test system 400. The difference is that the power noise susceptibility test system 500 uses a power supply voltage (3.3V) from an external power supply for a storage device (e.g., M.2 SSD), instead of the power supply voltage (12V) from a power supply of a host for a storage device (e.g., U.2 SSD). Further, the power noise susceptibility test system 500 includes a first path Path1 including a regulator 542.

In detail, the power noise susceptibility test system 500 may include a first relay 510, a second relay 520 and a third relay 530. The first relay 510 and the third relay 530 may be coupled through the first path Path1 or a second path Path2. The first relay 510, the second relay 520 and the third relay 530 may have the same structure and operation as the first relay 510, the second relay 520 and the third relay 530 of FIG. 4, respectively.

The first path Path1 may include a first regulator 542, an operational amplifier OPAMP 544 and a capacitor injection circuit 546. The operational amplifier OPAMP 544 and the capacitor injection circuit 546 correspond to the operational amplifier OPAMP 442 and the capacitor injection circuit 444 in FIG. 4, respectively. The first regulator 542 may receive the power supply voltage (3.3V) and regulate the power supply voltage to generate a first regulated power supply voltage (12V) greater than the power supply voltage (3.3V). The operational amplifier 544 may receive the noise function FG IN and generate a high noise function HF NOISE in response to the first regulated power supply voltage (12V). The capacitor injection circuit 546 may receive the power supply voltage (3.3V), the noise function FG IN and the high noise function HF NOISE and generate a low noise function LF NOISE and a first power noise corresponding to the sum of the power supply voltage and the high noise function {3.3V+HF NOISE}.

The second path Path2 may include a second regulator 552 and a power amplifier injection circuit 554. The second regulator 552 and the power amplifier injection circuit 554 correspond to the regulator 452 and the power amplifier injection circuit 454 in FIG. 4, respectively. The second regulator 552 may receive the power supply voltage (3.3V) and regulate the power supply voltage to generate a second regulated power supply voltage (8V) greater than the power supply voltage (3.3V). The power amplifier injection circuit 554 may receive the second regulated power supply voltage (8V) and the low noise function LF NOISE and generate a second power noise corresponding to the sum of the power supply voltage and the low noise function {3.3V+LF NOISE}.

The third relay 530 may selectively receive the first power noise {3.3V+HF NOISE} and the second power noise {3.3V+LF NOISE} in response to the frequency selection signal LF/HF SELECT and provide the storage device (M.2 SSD) with the selectively received power noise.

As noted above, the test platform 500 for M.2 SSD uses a different power noise injection shown in FIG. 5. While the signal LF/HF SELECT works and controls 3 SPDT relays the same way in FIG. 4, it has the following differences. First, there is one extra regulator to boost 3.3V to 12V for HF Noise generation by the operational amplifier 544. The power amplifier injection circuit 554 in this test platform uses a boosted 8V to reduce the voltage across the input and output of the amplifier to reduce heat dissipation. The current rating for the SPDT relays in FIG. 5 should be higher than that of FIG. 4. Heat sinks are also required for the power amplifier injection circuit 554. The remote control function remains the same as the test platform 400 for U.2 SSD. This M.2 test platform has the same advantages as the U.2 test platform.

FIG. 6 is a diagram illustrating a multiple power noise susceptibility test system 600 in accordance with an embodiment of the present invention. The hardware (HW) architecture of this test system 700 may be a major upgrade of the single SSD test platforms described in FIGS. 4 and 5, making the test of multiple storage devices (e.g., 4, 8, 16, or 32 SSDs) simultaneously possible. This test platform may be ideal for large scale SSD power noise susceptibility screening.

Referring FIG. 6, the multiple power noise susceptibility test system 600 may include a host 610, a function generator 620, an input/output (I/O) card 630, a plurality of storage devices (e.g., SSDs) 641-64N and a multiple noise injection backplane 650. The host 610 may include a power supply (not shown) configured to provide the multiple noise injection backplane 650 with a power supply voltage (e.g., 12V).

In some embodiments, the host 610 may be a high performance server with multiple PCIe lanes. For example, one x16 is minimum and dual x16 from the host 610 is preferred for 32 SSDs. The host 610 may be able to output high current (up to 100A for 32 SSDs) on 12V, otherwise an external high current power supply is needed. Power sequence and protection circuits are not shown in FIG. 6.

The function generator 620 may be coupled to the host 610 through a set bus (e.g., GPIB, USB, or Ethernet), generate a noise function (or noise) and provide the multiple noise injection backplane 650 with the noise function. The input/output (I/O) card 630 as a signal generator may be coupled to the host 610 through a set bus (e.g., USB), generate various operation signals and provide the multiple noise injection backplane 650 with the operation signals. In some embodiments, the operation signals may include a frequency selection signal LF/HF SELECT and a storage selection signal U.2 12V/M.2 3.3V SELECT.

The plurality of storage devices 641-64N may be coupled to the multiple noise injection backplane 650 through one or more multiple connectors 680 and one or more multiple SSD adaptors 690. Further, the multiple noise injection backplane 650 may be coupled to the host 610 through multiple peripheral component interconnect express (PCIe) links. In the illustrated example, the host 610 may be coupled to the multiple noise injection backplane 650 through 16 PCIe links.

The multiple noise injection backplane 650 may include multiple noise injection modules 701-70N for testing power noise susceptibility of the plurality of storage devices 641-64N, respectively. Further, the multiple noise injection backplane 650 may include a buffer array 660, an N channel PCIe multiplexer (MUX) 670, multiple connectors 680 and multiple SSD adaptors 690. That is, the multiple noise injection backplane 650 has a sophisticated modular backplane design with the PCIe MUX circuit, which is commonly used in server system design to link multiple SSDs.

Each of the multiple noise injection modules 701-70N may be provided with the power supply voltage (12V) from the host 610. Each of the multiple noise injection modules 701-70N may receive the frequency selection signal LF/HF SELECT and the storage selection signal U.2 12V/M.2 3.3V SELECT from the I/O card 630. Each of the multiple noise injection modules 701-70N may receive a noise function from the function generator 620 through the buffer array 660. In some embodiments, the buffer array 660 may include multiple buffers between the function generator 620 and the multiple noise injection modules 701-70N and each of the buffers corresponds to each of the multiple noise injection modules 701-70N. Each buffer may receive and store the noise function and output the noise function to a corresponding noise injection module among the multiple noise injection modules 701-70n. Thus, each of the multiple noise injection modules 701-70N may receive the noise function from the function generator 620 through the corresponding buffer of the buffer array 660.

Each of the multiple noise injection modules 701-70N may be coupled to a corresponding storage device among the plurality of storage devices 641-64N through corresponding multiple connector 680 and corresponding multiple SSD adaptor 690. Further, each of the multiple noise injection modules 701-70N may provide a corresponding storage device among the plurality of storage devices 641-64N with power noise for test {PWR+NOISE}.

The multiple noise injection backplane 650 may have the following advantages: 1) Fully automatic, with minimal human error risk; 2) Full bandwidth test, using only one function generator; 3) Test of one to thirty-two drives at the same time, saving total test time; 4) Each noise injection module is independent and replaceable; 5) Each SSD adaptor is independent and replaceable; 6) Noise injection module can handle different SSD form factors; 7) Ideal for large scale SSD screening, one drive failure won't affect others; and 8) Will work even if there is only one drive.

Figure 7:
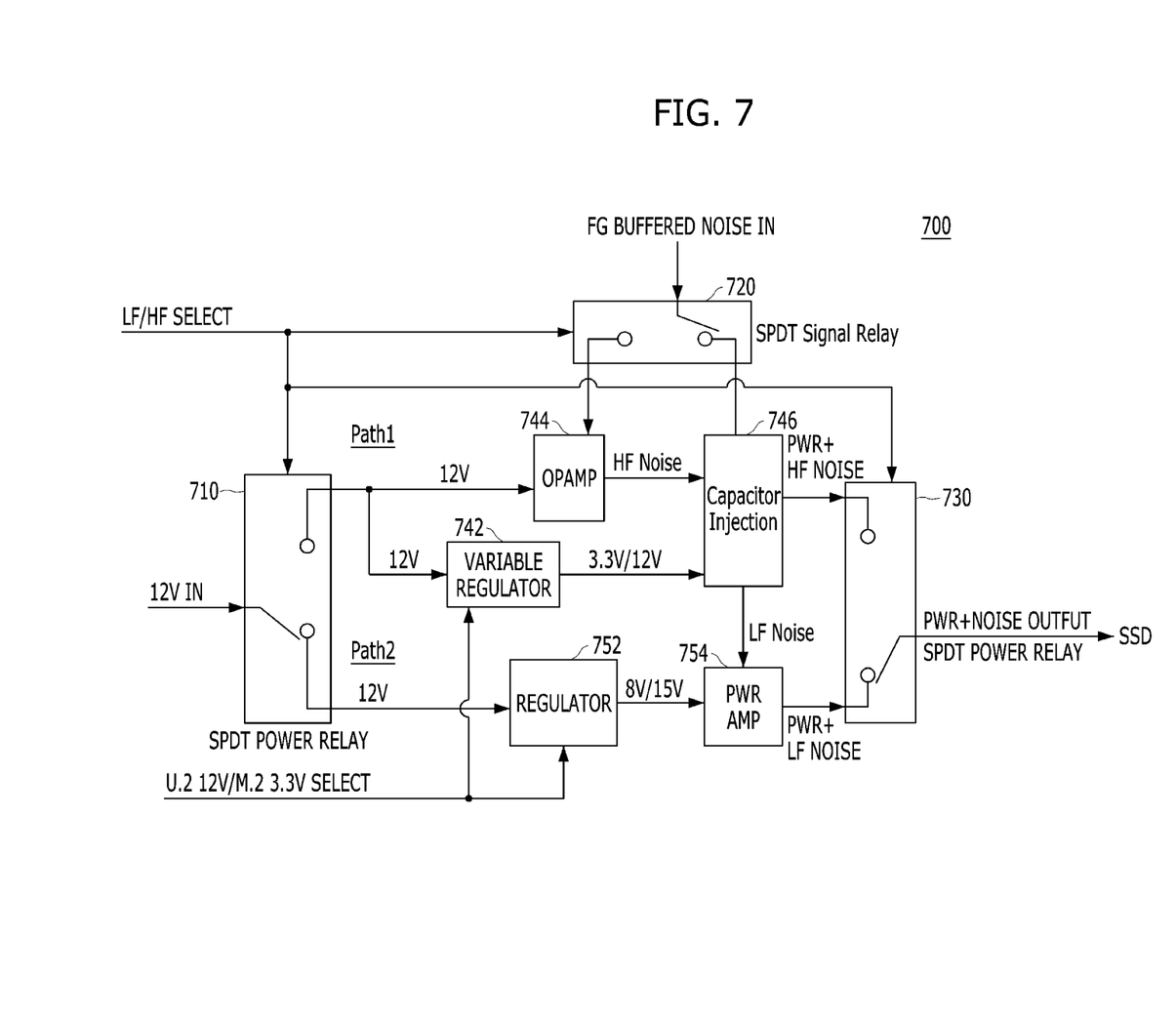
FIG. 7 is a diagram illustrating a power noise injection module in accordance with an embodiment of the present invention.

FIG. 7 is a diagram illustrating a power noise injection module 700 in accordance with an embodiment of the present invention. The power noise injection module 700 may be any of the multiple noise injection modules 701-70N in FIG. 6.

Referring FIG. 7, the power noise injection module 700 may have the structure and operation, which are similar to those of the power noise susceptibility test system 400 in FIG. 4. The difference is that the power noise injection module 700 generates first power noise for a high frequency band (i.e., high power noise) {PWR+HF NOISE} which is {3.3V+HF NOISE} or {12V+HF NOISE} and generates second power noise for a low frequency band (i.e., low power noise) {PWR+LF NOISE} which is {3.3V+LF NOISE} or {12V+LF NOISE}. For this operation, the power noise injection module 700 may include variable regulators 742 and 745.

In detail, the power noise injection module 700 may include a first relay 710, a second relay 720 and a third relay 730. The first relay 710 and the third relay 730 may be coupled through the first path Path1 or a second path Path2. The first relay 710, the second relay 720 and the third relay 730 may have the same structure and operation as the first relay 510, the second relay 520 and the third relay 530 of FIG. 4, respectively.

The first path Path1 may include an operational amplifier OPAMP 744 and a capacitor injection circuit 746. The operational amplifier OPAMP 744 and the capacitor injection circuit 746 correspond to the operational amplifier OPAMP 442 and the capacitor injection circuit 444 in FIG. 4, respectively. Further, the first path Path1 may include a first variable regulator 742.

The first variable regulator 742 may receive the power supply voltage (12V) and regulate the power supply voltage to generate a first regulated power supply voltage (3.3V or 12V) in response to the storage selection signal U.2 12V/M.2 3.3V SELECT. For example, the first variable regulator 742 may generate the first regulated power supply voltage (3.3V) in response to the storage selection signal M.2 3.3V SELECT and generate the first regulated power supply voltage (12V) in response to the storage selection signal U.2 12V SELECT.

The operational amplifier 744 may receive the noise function FG IN and generate a high noise function HF NOISE in response to the first regulated power supply voltage (12V). The capacitor injection circuit 746 may receive the power supply voltage (3.3V or 12V), the noise function FG IN and the high noise function HF NOISE and generate a low noise function LF NOISE and a first power noise corresponding to the sum of the power supply voltage and the high noise function {(3.3V+HF NOISE) or (12V+HF NOISE)}.

The second path Path2 may include a second variable regulator 752 and a power amplifier injection circuit 754. The power amplifier injection circuit 754 corresponds to the power amplifier injection circuit 454 in FIG. 4.

The second variable regulator 752 may receive the power supply voltage (12V) and regulate the power supply voltage to generate a first regulated power supply voltage (8V or 15V) in response to the storage selection signal U.2 12V/M.2 3.3V SELECT. For example, the second variable regulator 752 may generate the second regulated power supply voltage (8V) in response to the storage selection signal M.2 3.3V SELECT and generate the second regulated power supply voltage (15V) in response to the storage selection signal U.2 12V SELECT. The power amplifier injection circuit 754 may receive the second regulated power supply voltage (8V or 15V) and the low noise function LF NOISE and generate a second power noise corresponding to the sum of the power supply voltage and the low noise function {(3.3V+LF NOISE) or (12V+LF NOISE)}.

The third relay 530 may selectively receive the first power noise {3.3V+HF NOISE} or {12V+HF NOISE} and the second power noise {3.3V+LF NOISE} or {12V+LF NOISE} in response to the frequency selection signal LF/HF SELECT and provide the storage device (M.2 SSD) with the selectively received power noise.

As described above, embodiments provide systems for a power noise susceptibility test of one or more storage devices. Embodiments automatically test power noise susceptibility of one or more storage devices and support full frequency bandwidth test.

Although the foregoing embodiments have been illustrated and described in some detail for purposes of clarity and understanding, the present invention is not limited to the details provided. There are many alternative ways of implementing the present invention, as one skilled in the art will appreciate in light of the foregoing disclosure. The disclosed embodiments are thus illustrative, not restrictive. The present invention is intended to embrace all modifications and alternatives that fall within the scope of the appended claims.

What is claimed is:

1. A system comprising:
a host including a power supply configured to provide a power supply voltage;
a plurality of storage devices coupled to the host through multiple peripheral component interconnect express (PCIe) links; and
multiple noise injection modules for testing power noise susceptibility of the plurality of storage devices,
wherein each noise injection module includes:
a first relay configured to receive the power supply voltage and output the power supply voltage to a first path or a second path in response to a frequency selection signal;
a second relay configured to receive a noise function and output the noise function to the first path or the second path in response to the frequency selection signal; and
a third relay coupled to the first path or the second path in response to the frequency selection signal and the storage device,
wherein the first path includes:
an operational amplifier configured to receive the noise function and generate a high noise function in response to the power supply voltage;
a first variable regulator configured to receive and regulate the power supply voltage to generate a first or second regulated power supply voltage in response to a voltage selection signal; and
a capacitor injection circuit configured to receive the first or second regulated power supply voltage, the noise function and the high noise function and generate a low noise function and a first power noise corresponding to the sum of the first or second regulated power supply voltage and the high noise function, and
wherein the second path includes:
a second variable regulator configured to receive and regulate the power supply voltage to generate a third or fourth regulated power supply voltage in response to the voltage selection signal; and
a power amplifier injection circuit configured to receive the third or fourth regulated power supply voltage and the low noise function and generate a second power noise corresponding to the sum of the third or fourth regulated power supply voltage and the low noise function, and
wherein the third relay selectively receives the first power noise and the second power noise in response to the frequency selection signal and provides the storage device with the selectively received power noise.

2. The system of claim 1, wherein the first relay includes a single pole double throw (SPDT) relay having a single pole configured to receive the power supply voltage, a first throw coupled to the first path and a second throw coupled to the second path, and provides the first path or the second path with the power supply voltage in response to the frequency selection signal.

3. The system of claim 1, wherein the second relay includes a single pole double throw (SPDT) relay having a single pole configured to receive the noise function, a first throw coupled to the operational amplifier and a second throw coupled to the capacitor injection circuit and providing the operational amplifier or the capacitor injection circuit with the noise function in response to the frequency selection signal.

4. The system of claim 1, wherein the third relay includes a single pole double throw (SPDT) relay having a first throw coupled to the capacitor injection circuit, a second throw coupled to the power amplifier and a single pole configured to the storage device and selectively provides the storage device with the first power noise and the second power noise in response to the frequency selection signal.

5. The system of claim 1, wherein one of the plurality of storage devices includes an U.2 solid state drive (SSD) and another of the plurality of storage devices includes an M.2 SSD.

6. The system of claim 1, wherein the power supply voltage and the second regulated power supply voltage have a first voltage level, and the first regulated power supply voltage has a second voltage level less than the first voltage level.

7. The system of claim 1, wherein the power supply voltage has a first voltage level, the third regulated power supply voltage has a second voltage level less than the first voltage level and the fourth regulated power supply voltage has a third voltage level greater than the first voltage level.

8. The system of claim 1, further comprising:
a function generator configured to generate the noise function.

9. The system of claim 8, further comprising:
a buffer array including multiple buffers coupled between the function generator and the multiple noise injection modules, each buffer configured to receive and store the noise function and output the noise function to a corresponding noise injection module among the multiple noise injection modules.

10. The system of claim 1, further comprising:
a signal generator configured to generate the frequency selection signal and the voltage selection signal.

11. A system for testing power noise susceptibility of a storage device, the system comprising:
a first relay configured to receive a power supply voltage and output the power supply voltage to a first path or a second path in response to a frequency selection signal;
a second relay configured to receive a noise function and output the noise function to the first path in response to the frequency selection signal; and
a third relay coupled to the first path or the second path in response to the frequency selection signal and the storage device,
wherein the first path includes:
an operational amplifier configured to receive the noise function and generate a high noise function in response to the power supply voltage; and
a capacitor injection circuit configured to receive the power supply voltage, the noise function and the high noise function and generate a low noise function and a first power noise corresponding to the sum of the power supply voltage and the high noise function, and
wherein the second path includes:
a regulator configured to receive the power supply voltage and regulate the power supply voltage to generate a regulated power supply voltage; and
a power amplifier injection circuit configured to receive the regulated power supply voltage and the low noise function and generate a second power noise corresponding to the sum of the power supply voltage and the low noise function,
wherein the third relay selectively receives the first power noise and the second power noise in response to the frequency selection signal and provides the storage device with the selectively received power noise.

12. The system of claim 11, wherein the first relay includes a single pole double throw (SPDT) relay having a single pole configured to receive the power supply voltage, a first throw coupled to the first path and a second throw coupled to the second path, and provides the first path or the second path with the power supply voltage in response to the frequency selection signal.

13. The system of claim 11, wherein the second relay includes a single pole double throw (SPDT) relay having a single pole configured to receive the noise function, a first throw coupled to the operational amplifier and a second throw coupled to the capacitor injection circuit, and provides the operational amplifier or the capacitor injection circuit with the noise function in response to the frequency selection signal.

14. The system of claim 11, wherein the third relay includes a single pole double throw (SPDT) relay having a first throw coupled to the capacitor injection circuit, a second throw coupled to the power amplifier and a single pole configured to the storage device and selectively provides the storage device with the first power noise and the second power noise in response to the frequency selection signal.

15. The system of claim 11, wherein the power supply voltage is received from a power supply of a host and the storage device includes an U.2 solid state drive (SSD).

16. A system for testing power noise susceptibility of a storage device, the system comprising:
a first relay configured to receive a power supply voltage and output the power supply voltage to a first path or a second path in response to a frequency selection signal;
a second relay configured to receive a noise function and output the noise function to the first path or the second path in response to the frequency selection signal; and
a third relay coupled to the first path or the second path in response to the frequency selection signal and the storage device,
wherein the first path includes:
a first regulator configured to receive the power supply voltage and regulate the power supply voltage to generate a first regulated power supply voltage;
an operational amplifier configured to receive the noise function and generate a high noise function in response to the first regulated power supply voltage; and
a capacitor injection circuit configured to receive the power supply voltage, the noise function and the high noise function and generate a low noise function and a first power noise corresponding to the sum of the power supply voltage and the high noise function, and
wherein the second path includes:
a second regulator configured to receive the power supply voltage and regulate the power supply voltage to generate a second regulated power supply voltage; and
a power amplifier injection circuit configured to receive the second regulated power supply voltage and the low noise function and generate a second power noise corresponding to the sum of the power supply voltage and the low noise function, and
wherein the third relay selectively receives the first power noise and the second power noise in response to the frequency selection signal and provides the storage device with the selectively received power noise.

17. The system of claim 16, wherein the first relay includes a single pole double throw (SPDT) relay having a single pole configured to receive the power supply voltage, a first throw coupled to the first path and a second throw coupled to the second path and provides the first path or the second path with the power supply voltage in response to the frequency selection signal.

18. The system of claim 16, wherein the second relay includes a single pole double throw (SPDT) relay having a single pole configured to receive the noise function, a first throw coupled to the operational amplifier and a second throw coupled to the capacitor injection circuit and provides the operational amplifier or the capacitor injection circuit with the noise function in response to the frequency selection signal.

19. The system of claim 16, wherein the third relay includes a single pole double throw (SPDT) relay having a first throw coupled to the capacitor injection circuit, a second throw coupled to the power amplifier injection circuit and a single pole configured to the storage device and selectively provides the storage device with the first power noise and the second power noise in response to the frequency selection signal.

20. The system of claim 16, wherein the power supply voltage is received from an external power supply and the storage device includes an M.2 SSD.

\* \* \* \* \*